US008000156B2

(12) United States Patent
Van Winkelhoff et al.

(10) Patent No.: US 8,000,156 B2
(45) Date of Patent: Aug. 16, 2011

(54) MEMORY DEVICE WITH PROPAGATION CIRCUITRY IN EACH SUB-ARRAY AND METHOD THEREOF

(75) Inventors: Nicolaas Klarinus Johannes Van Winkelhoff, Villard-Bonnot (FR); Christophe Denis Lucien Frey, Meylan (FR)

(73) Assignee: ARM Limited, Cambridge (GB)

( * ) Notice: Subject to any disclaimer, the term of this patent is extended or adjusted under 35 U.S.C. 154(b) by 473 days.

(21) Appl. No.: 12/289,341

(22) Filed: Oct. 24, 2008

(65) Prior Publication Data

US 2010/0103747 A1    Apr. 29, 2010

(51) Int. Cl.
*G11C 7/10* (2006.01)
(52) U.S. Cl. ......... 365/189.15; 365/189.14; 365/189.17; 365/189.05; 365/230.03; 365/233.19
(58) Field of Classification Search ............. 365/230.03, 365/189.15, 189.16, 189.14, 189.17, 189.05, 365/233.16, 233.17, 233.19, 233.1
See application file for complete search history.

(56) References Cited

U.S. PATENT DOCUMENTS 5,453,708 A * 9/1995 Gupta et al. .................... 326/98
5,668,761 A    9/1997 Muhich et al.
2010/0103747 A1 * 4/2010 Van Winkelhoff et al. ................ 365/189.05

* cited by examiner

Primary Examiner — Andrew Q Tran
(74) Attorney, Agent, or Firm — Nixon & Vanderhye P.C.

(57) ABSTRACT

A memory device and method of operating such a device are provided. The memory device has a plurality of sub-arrays arranged to form at least one sub-array column having a first end and a second end, with each sub-array comprising a plurality of memory cells arranged in a plurality of memory cell rows and at least one memory cell column. Sub-array access circuitry is associated with each sub-array, for detecting read data from a selected memory cell column of the associated sub-array during a read operation, and global access circuitry then interfaces with the first end of the sub-array column. Each sub-array access circuitry comprises propagation circuitry for producing an output read data value, the propagation circuitry having a first input for receiving the read data detected from the associated sub-array during a read operation and a second input for receiving an output read data value produced by a linked sub-array access circuitry associated with a sub-array nearer the second end of the sub-array column. The propagation circuitry receives a control signal for identifying which of its first or second inputs should be used to produce the output read data value. As a result, an output read data value produced by any sub-array access circuitry is propagated to the global access circuitry via any linked sub-array access circuitry in the sub-array column between that sub-array access circuitry and the global access circuitry. This provides a particularly simple technique for propagating the read data value to the global access circuitry, which has both predictable timing, and consumes low power.

12 Claims, 11 Drawing Sheets

MEMORY DEVICE WITH PROPAGATION CIRCUITRY IN EACH SUB-ARRAY AND METHOD THEREOF

BACKGROUND OF THE INVENTION

1. Field of the Invention

The present invention relates to a memory device and method of operating such a memory device, and in particular to the operation of memory devices of the type where a plurality of sub-arrays are provided to reduce the size of the bit lines within the memory device.

2. Description of the Prior Art

A typical memory device will have an array of memory cells arranged in a plurality of rows and a plurality of columns, and access circuitry will be provided in association with the memory array to enable individual memory cells within the array to be accessed for the purposes of writing data to, and/or reading data from, that memory cell.

There is an increasing demand for memory devices to be constructed which are smaller and consume less power than their predecessor designs, whilst retaining high performance. New technologies are being developed which allow a reduction in the size of the individual transistors making up each memory cell, and indeed the transistors making up the associated access control circuitry. However, as the memory cells decrease in size, the variation in behavior between individual memory cells tends to increase, and this can adversely affect predictability of operation. One particular issue that arises is that as the size of the transistors decrease, they exhibit more leakage current. Hence, considering the transistors making up each memory cell, this will cause an increase in leakage current onto the bit line or bit lines connected to those memory cells. The effect of this is that the leakage will affect the maximum length of bit line which can be supported within the memory device whilst ensuring correct operation.

One way to seek to address this problem is to partition up each column in the memory device to form a plurality of separate columns in the vertical (column) direction, thus creating a plurality of sub-arrays in the bit line direction of the memory device. Each sub-array then needs to be provided with some local access circuitry (also referred to herein as local input/output (IO) circuitry) to enable data to be read from the sub-array (and if the memory cells can be re-written, to enable data to be written to the sub-array), with the various local access circuits then being connected to global access circuitry (also referred to herein as global IO circuitry) responsible for outputting data from the memory device (and optionally for receiving write data to be written into the memory device).

FIG. 1 illustrates a memory device 100 of the above type, where the memory array is divided up into a plurality of sub-arrays and associated local IO circuitry. Each sub-array and associated local IO circuitry may be constructed using the techniques of embodiments of the present invention. As shown in FIG. 1, a plurality of sub-array columns 130 are provided. Whilst in this illustrative embodiment six sub-array columns are shown, it will be appreciated that in a typical memory device there may be significantly more sub-array columns provided. Each sub-array column 130 is divided up into a plurality of sub-arrays 110, each sub-array 110 having associated local IO circuitry 120. In the illustrative example shown in FIG. 1, each sub-array column is divided up into four sub-arrays 110 and associated local IO circuits 120, but it will be appreciated that in a typical memory device there may be significantly more than four sub-array structures provided within each sub-array column 130.

By dividing each sub-array column 130 into a plurality of sub-arrays, the length of the bit lines provided within the memory device can be significantly reduced, when compared with a memory device where each column includes only a single memory array. This is particularly beneficial when using modern memory technologies such as 45 nm technology, where the individual transistors are very small, and leakage current is hence an issue. By keeping the bit line length relatively short, it can be ensured that the leakage current from memory cell transistors does not affect the correct operation of the memory device.

The memory device 100 has a global control block 140 which is used to control the operation of the global row decoder 160 and the global IO circuits 150. For a specified memory address, the global row decoder will be arranged to identify a word line within the memory device containing the addressed memory cell, and to issue an enable signal to that word line, enabling the addressed memory cell to be read from for a read operation, or to be written to for a write operation. Meanwhile, the global IO circuitry can identify based on the address the relevant column containing the addressed memory cell, and hence issue one or more control signals to the required local IO circuitry 120 to cause a read data value to be sensed and output to the global IO circuitry in the event of a read operation, or to cause write data to be input into the relevant column during a write operation. Hence, via the global row decoder 160, the global IO circuitry 150 and the relevant local IO circuitry 120, an addressed memory cell 170 can be accessed.

Various circuitry is typically provided within the local IO circuitry, including column multiplexer circuitry for selecting a particular memory cell column within the associated sub-array, and sense amplifier circuitry for detecting the data value stored in the addressed memory cell within that selected column. If the memory cells can also be written to, the local IO circuitry will typically include write transistors to generate the required data value for storing in an addressed memory cell during a write operation.

The memory cells can take a variety of forms, for example ROM, DRAM or SRAM memory cells. Typically each memory cell stores a single bit data value, and accordingly if the data being accessed is a multi-bit data word (e.g. 32 bits, 64 bits, etc), it will be necessary to access multiple memory cells. In a typical design, column multiplexers will be provided corresponding to each bit of the data word, each column multiplexer being connected to the bit lines for a plurality of columns containing memory cells in which the associated bit of the data word can be stored. The memory array can hence be considered to be formed of a plurality of sections, one for each column multiplexer. Hence, by way of example, a memory array may have 512 word lines, a multiplexer size of four (meaning four columns are connected to each column multiplexer), and a data word size of 32 bits (meaning there are 32 column multiplexers, each column multiplexer being connected to a corresponding section of the memory array). Such a memory can hence store 2048 32-bit data words.

As shown schematically by FIGS. 2A and 2B, whilst the local IO circuitry 205 may physically be placed to one side of the sub-array 200 (as shown in FIG. 2A), it can alternatively be provided at a central location 215 between two sub-array parts 210, 220, as shown in FIG. 2B. In this latter arrangement, the sub-array is considered to consist of both the first sub-array part 210 and the second sub-array part 220.

When adopting a memory design such as that shown schematically in FIG. 1, an issue that arises is how to efficiently output the read data detected by the local IO circuitry 120 to the global IO circuitry 150. As memory devices increase in size, then the distances from the locally sensed output within the local IO circuitry to the global IO circuitry become larger, and accordingly it is important to provide a fast way to port the information from the local IO circuitry to the global IO circuitry. Whereas in the older style of memory devices where bit lines ran the full length of the memory array, and a single sense amplifier was provided at the bottom of the bit lines to sense the read data values, for memory devices arranged as shown in FIG. 1 and employing modern memory technologies such as 45 nm technology, the individual transistors making up the memory cells are no longer strong enough to drive their output over such long bit lines, and accordingly sense amplifier circuitry is typically provided locally as part of the local IO circuitry of the sub-array. A difficulty that then arises is how to route that locally sensed read data to the global IO circuitry.

One prior art technique used to seek to address this problem is shown schematically in FIG. 3. As shown in FIG. 3, each local sub-array 300, 320 has local column multiplexer/sense amplifier circuitry 310, 330 connected to the local bit lines 305, 325 running through the sub-array. The local sense amplifiers within the circuits 310, 330 amplify the detected read signal from the local bit lines, and propagate it onto the global bit lines 340, 350. To limit power consumption and gain speed, a global sense amplifier (typically with some associated latch circuitry) 360 is used to re-sense the read data value from the voltages on the global bit lines 340, 350. Hence, the output from the local sense amplifiers in this case generate a new "to-be-sensed" signal for routing to a global sense amplifier 360. Such a technique is discussed in an IBM paper entitled "A 450 ps Access-Time SRAM Macro in 45 nm SOI Featuring a Two-Stage Sensing-Scheme and Dynamic Power Management" published in ISSCC 2008/Feb. 5, 2008/ 2:00 PM, 978-1-4244-2010-0/08/$25.00(c)2008 IEEE, 2008 IEEE International Solid-State Circuits Conference.

Such an approach is attractive since it is modular, and accordingly can still be used as the number of sub-arrays in each column of the memory device increases. However, a significant disadvantage of the approach is that the timing issues arising from sensing and then re-sensing a data value using a sequence of two separate sense amplifiers become very complex. It is difficult to time the two sense amplifiers in a precise manner without losing timing margins at both sensing locations. For each different design of memory device, the timing of the two sense amplifiers will need to be tuned having regard to the number of sub-arrays in each sub-array column. Such an approach will lead to the loss of timing margins, an increase in power consumption and an overall decrease in the speed of operation.

Another known prior art technique is a tree-based scheme such as that shown schematically in FIG. 4. In particular, FIG. 4 shows four sub-arrays and their associated local IO circuits 400, 410, 420, 430 arranged in a sub-array column, with the sub-array 430 being located physically closest to the global IO circuitry 470. Between the various sub-arrays, combining circuitry 440, 450, 460 are provided, and these combining circuits are interconnected such that the read data output from any sub-array can be output to the global IO circuitry in a predetermined number of steps, namely three steps in the particular example shown in FIG. 4. However, the actual form of each combining circuit 440, 450, 460 will depend on where that combining circuit resides, and as more sub-arrays are added to a sub-array column, the form of the combining circuits will change. Hence, every combining stage needs its own particular configuration of logic gates to perform the required combination function, and the actual form of logic at each combining stage will depend on the number of sub-arrays in each sub-array column. Further, it can be seen that the routing paths rapidly become very complex, and the total distance involved between any particular sub-array and the global IO circuitry is in many cases more than the total height of the memory. Accordingly, this results in significant power consumption. Such an approach is useful in small memories such as cache memories, since whilst the size of the memories is small, this approach gives a relatively high speed solution, and does not exhibit the timing problems of the earlier-mentioned FIG. 3 approach. However, as the size of the memory increases, and in particular the number of sub-arrays in each sub-array column increases, then the performance rapidly decreases.

Accordingly, it would be desirable to develop an improved technique for routing the read data sensed by local access circuitry of a sub-array to the global access circuitry, and in particular to develop an approach which could be used irrespective of the number of sub-arrays in a sub-array column without exhibiting the timing issues associated with the prior art of FIG. 3, and without involving the complexities and re-design issues of the prior art of FIG. 4.

SUMMARY OF THE INVENTION

Viewed from a first aspect, the present invention provides a memory device, comprising: a plurality of sub-arrays arranged to form at least one sub-array column having a first end and a second end, each sub-array comprising a plurality of memory cells arranged in a plurality of memory cell rows and at least one memory cell column; sub-array access circuitry associated with each sub-array, for detecting read data from a selected memory cell column of said associated sub-array during a read operation; and global access circuitry arranged to interface with said first end of said at least one sub-array column; each sub-array access circuitry comprising propagation circuitry for producing an output read data value, the propagation circuitry having a first input for receiving the read data detected from the selected memory cell column of said associated sub-array during said read operation and a second input for receiving an output read data value produced by a linked sub-array access circuitry associated with a sub-array in said sub-array column nearer said second end of the sub-array column, and the propagation circuitry receiving a control signal for identifying which of the first or second inputs is to be used to produce the output read data value; whereby an output read data value produced by any sub-array access circuitry is propagated to the global access circuitry via any linked sub-array access circuitry in the sub-array column between that sub-array access circuitry and the global access circuitry.

In accordance with the present invention each sub-array access circuitry incorporates propagation circuitry for producing an output read data value. The propagation circuitry has two inputs, a first input for receiving the read data detected in the associated sub-array in the event that the addressed memory cell is in that sub-array, and the second input for receiving an output read data value produced by a linked sub-array access circuitry associated with a sub-array that is more distant from the global access circuitry. A control signal is input to the propagation circuitry to identify which of the first or second inputs should be used to produce the output read data value. In practice, this control signal can be derived from the word line select signal input to the various sub-arrays such that if the addressed memory cell does reside in a particular sub-array and accordingly a word line in that sub-array is activated, then the control signal will cause the propagation circuitry to use its first input in order to produce the output read data value, whereas otherwise the second input will be used.

By such a mechanism, whichever sub-array the addressed memory cell resides in, the output read data value generated from that sub-array can be propagated to the global access circuitry via any linked sub-array access circuitry interposed between that sub-array and the global access circuitry.

This solution provides a very simple technique which is both timing and power predictable. In particular, the propagation delay between two linked sub-array blocks is predetermined and so there are no complex timing issues to address. Further, the technique is entirely modular, since the sub-array and associated sub-array access circuitry can be constructed in the same manner irrespective of the location of that sub-array within the sub-array column. Further, the propagation paths are significantly less complex than the prior art of FIG. 4, since each time an output data value is propagated from one sub-array block, it moves closer to the global IO circuitry. Furthermore, unlike the prior art of FIG. 4, the maximum propagation path required to output a data value from the top sub-array in a sub-array column to the global IO circuitry at the bottom of the sub-array column is no longer than the height of the sub-array column, thus significantly reducing the power consumption relative to the technique of FIG. 4.

Indeed, the technique of the present invention provides a very low power solution. In particular, the sub-array blocks nearer the global IO circuitry consume relatively little power, since the propagation path is very short, in contrast to the prior art of FIG. 4, where considering the example of the sub-array 430, the propagation path proceeds via combining circuits 450 and 460 before being routed to the global IO circuitry 470. Even those sub-array blocks furthest from the global IO circuitry consume less power than the equivalent blocks in the prior art of FIG. 4 when a read operation is performed, since the propagation path is more direct.

The propagation circuitry can take a variety of forms. However, in one embodiment, the propagation circuitry comprises a first transfer gate connected to the first input, and a second transfer gate connected to the second input, the control signal identifying which of the first and second transfer gates is to be used to produce the output read data value. In one particular embodiment, each transfer gate is constructed using an NMOS transistor and a PMOS transistor arranged back to back, thereby allowing both logic zero and logic one values to be transferred without loss.

In one embodiment, each sub-array access circuitry further comprises a buffer circuit for amplifying the output read data value. By using such buffer circuitry, the same drive strength and thus speed can be assured for each propagation path between a sub-array access circuit and its linked sub-array access circuit. This hence serves to ensure a high speed transfer between linked sub-array access circuits, whilst also giving a pre-predicted delay.

The buffer circuits can be arranged in a variety of ways. However, in one embodiment, each buffer circuit is formed by an inverter circuit. Such an inverter circuit provides a very efficient mechanism for amplifying the output read data value.

In one embodiment where such inverter circuits are used, then for each sub-array the number of inverter circuits that the read data detected from the selected memory cell column of said sub-array will pass through as that read data is propagated to the global input-output circuitry determines the representation of that read data provided to the first input of the propagation circuitry within the associated sub-array access circuitry. This can be achieved in a variety of ways. For example, if there are an odd number of inverters between any particular sub-array and the global IO circuitry, the data values stored in that sub-array can be stored as the inverse of the provided write data, such that by the time any read signal is received by the global IO circuitry, it will represent the correct read data value. Alternatively, the data values can be stored unaltered in the sub-array, but their value can be flipped as they are read out prior to being passed to the propagation circuitry. Obviously, for any sub-arrays where there is an even number of inverter circuits between its sensed output and the global IO circuitry, no such modifications are required.

In one embodiment, each sub-array access circuitry comprises latch circuitry for storing the read data detected from the selected memory cell column of said associated sub-array during said read operation. By latching the read data locally within the sub-array access circuitry, this removes any timing issues with regard to the length of time the sense amplifier circuitry has to remain enabled, since once the value is latched the sense amplifier circuitry can be turned off, and the bit lines can be pre-charged back to the supply voltage Vdd.

In one embodiment, for each sub-array access circuitry the linked sub-array access circuitry is that sub-array access circuitry associated with an adjacent sub-array in said sub-array column nearer said second end of the sub-array column. Hence, in such embodiments one propagation path is provided through the sub-array column, passing through each of the sub-arrays in turn. However, it is not essential for the linked sub-arrays to be defined in such a way, and in an alternative embodiment, every alternate sub-array can be linked, thereby creating two parallel propagation paths through the sub-array column to the global IO circuitry. In such embodiments, the global IO circuitry will then select between the signal received over the two paths, dependent on which sub-array contained the addressed memory cell. It will be appreciated that in other embodiments more than two propagation paths could be created if desired.

In one embodiment, the sub-array access circuitry associated with the sub-array nearest the second end of said sub-array column has no linked sub-array access circuitry connected to the second input of its propagation circuitry, and the second input of the propagation circuitry in that sub-array access circuitry is not used.

The present invention is applicable to a wide variety of memory devices, and in particular the memory cells can take a variety of forms, for example ROM, DRAM, SRAM, etc. However, in one embodiment, the memory cells can be subjected to both write operations and read operations, and each sub-array access circuitry is further arranged to provide write data to a selected memory cell column of said associated sub-array during a write operation.

In one embodiment, the time taken to propagate a read data value to the global IO circuitry will vary dependent on which sub-array the addressed memory cell resides in. In many implementations, this will not be problematic, and the system in which the memory device resides may be able to gain a timing advantage from the read data values that are output more quickly. However, in an alternative embodiment, additional circuitry is provided which has the effect of making the read access time the same irrespective of the sub-array in which the addressed memory cell resides. In particular, in one embodiment, each sub-array in said sub-array column receives a word line select signal identifying a memory cell row contained an addressed memory cell, for those sub-arrays in the sub-array column whose associated sub-array access circuitry are linked, the timing of the receipt of said word line select signal being staggered to ensure that the time at which the output read data value is received by the global access circuitry is independent of which sub-array the addressed memory cell resides in. Hence, by staggering receipt of the word line select signal, this staggers the time at which read data is accessed dependent on the location of the sub-array within the sub-array column, and this staggering can be chosen so as to ensure read data is received by the global IO circuitry at a consisting timing, irrespective of the sub-array from which the read data is read.

In one particular embodiment, the timing of the receipt of said word line select signal is staggered by staggering receipt of a clock signal by each sub-array. In one particular embodiment, this can be achieved by adding buffer circuits along the clock signal propagation path, with each sub-array being driven by the clock signal as taken from a different point along that clock signal propagation path. Hence, in embodiments where inverter circuits are used to propagate the output data values between linked sub-array access circuits, similar inverter circuits can also be inserted in the clock signal propagation path.

Viewed from a second aspect, the present invention provides a method of operating a memory device, the memory device comprising a plurality of sub-arrays arranged to form at least one sub-array column having a first end and a second end, each sub-array comprising a plurality of memory cells arranged in a plurality of memory cell rows and at least one memory cell column, sub-array access circuitry associated with each sub-array for detecting read data from a selected memory cell column of said associated sub-array during a read operation, and global access circuitry arranged to interface with said first end of said at least one sub-array column, the method comprising the steps of: within each sub-array access circuitry: (i) receiving at a first input the read data detected from the selected memory cell column of said associated sub-array during said read operation; (ii) receiving at a second input an output read data value produced by a linked sub-array access circuitry associated with a sub-array in said sub-array column nearer said second end of the sub-array column; and (iii) producing an output read data value in dependence on a control signal identifying which of the first or second inputs is to be used to produce the output read data value; whereby an output read data value produced by any sub-array access circuitry is propagated to the global access circuitry via any linked sub-array access circuitry in the sub-array column between that sub-array access circuitry and the global access circuitry.

Viewed from a third aspect, the present invention provides a memory device, comprising: a plurality of sub-array means arranged to form at least one sub-array column having a first end and a second end, each sub-array means comprising a plurality of memory cell means arranged in a plurality of memory cell rows and at least one memory cell column; sub-array access means associated with each sub-array means, for detecting read data from a selected memory cell column of said associated sub-array means during a read operation; and global access means for interfacing with said first end of said at least one sub-array column; each sub-array access means comprising propagation means for producing an output read data value, the propagation means having a first input for receiving the read data detected from the selected memory cell column of said associated sub-array means during said read operation and a second input for receiving an output read data value produced by a linked sub-array access means associated with a sub-array means in said sub-array column nearer said second end of the sub-array column, and the propagation means for receiving a control signal for identifying which of the first or second inputs is to be used to produce the output read data value; whereby an output read data value produced by any sub-array access means is propagated to the global access means via any linked sub-array access means in the sub-array column between that sub-array access means and the global access means.

BRIEF DESCRIPTION OF THE DRAWINGS

The present invention will be described further, by way of example only, with reference to embodiments thereof as illustrated in the accompanying drawings, in which.

DESCRIPTION OF EMBODIMENTS

Figure 5:
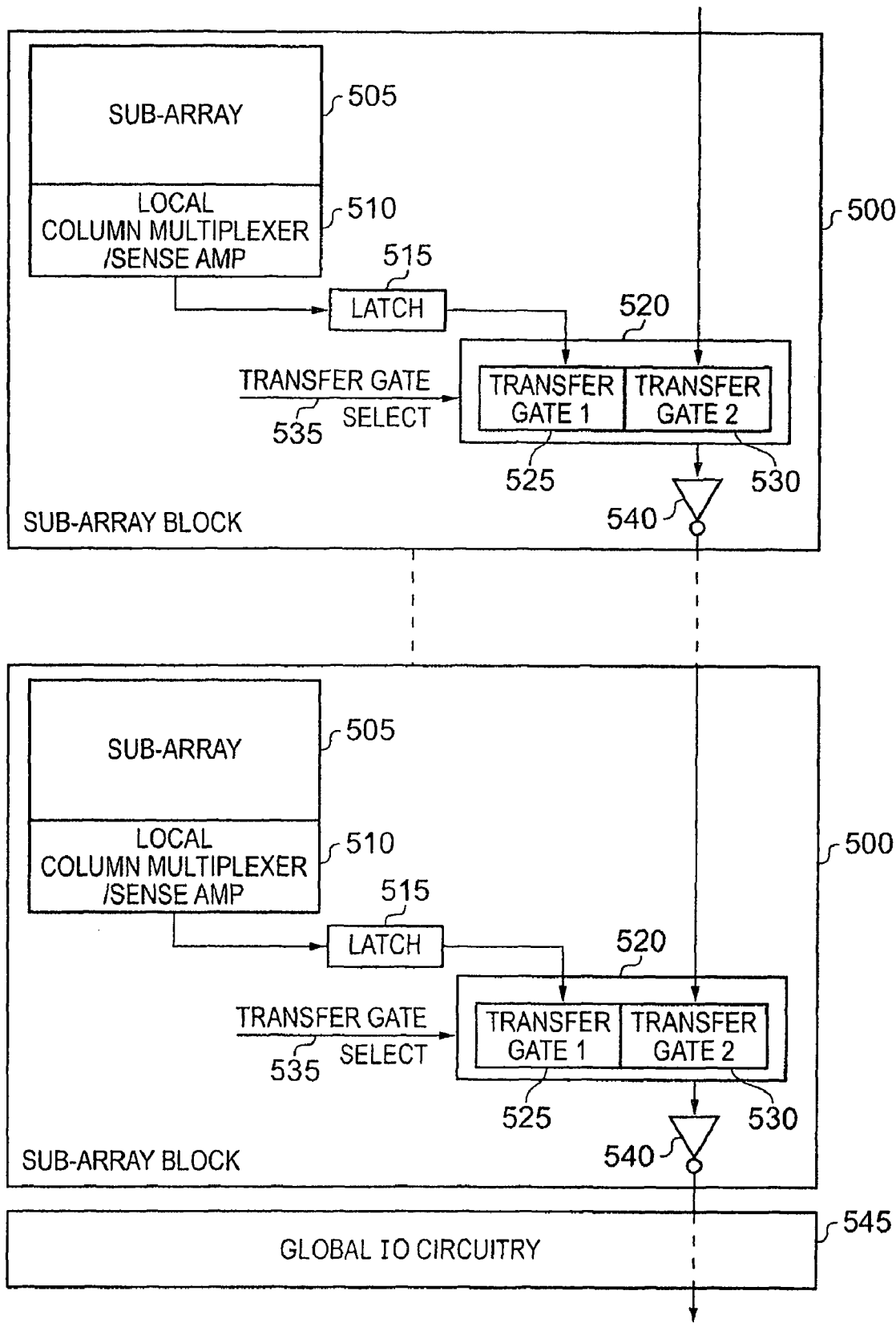
FIG. 5 illustrates components provided within each sub-array block in accordance with one embodiment of the present invention, in order to provide an efficient mechanism for routing read data values from an addressed memory cell to the global IO circuitry.

FIG. 5 schematically illustrates the components provided within a column of sub-array blocks in accordance with one embodiment of the present invention. Considering the example arrangement of FIG. 1, FIG. 5 can be considered to illustrate one sub-array column 130, each of the sub-array blocks 500 in FIG. 5 being used to form the sub-array 110 and associated local IO circuitry 120 when employing the techniques of embodiments of the present invention.

Figure 1:
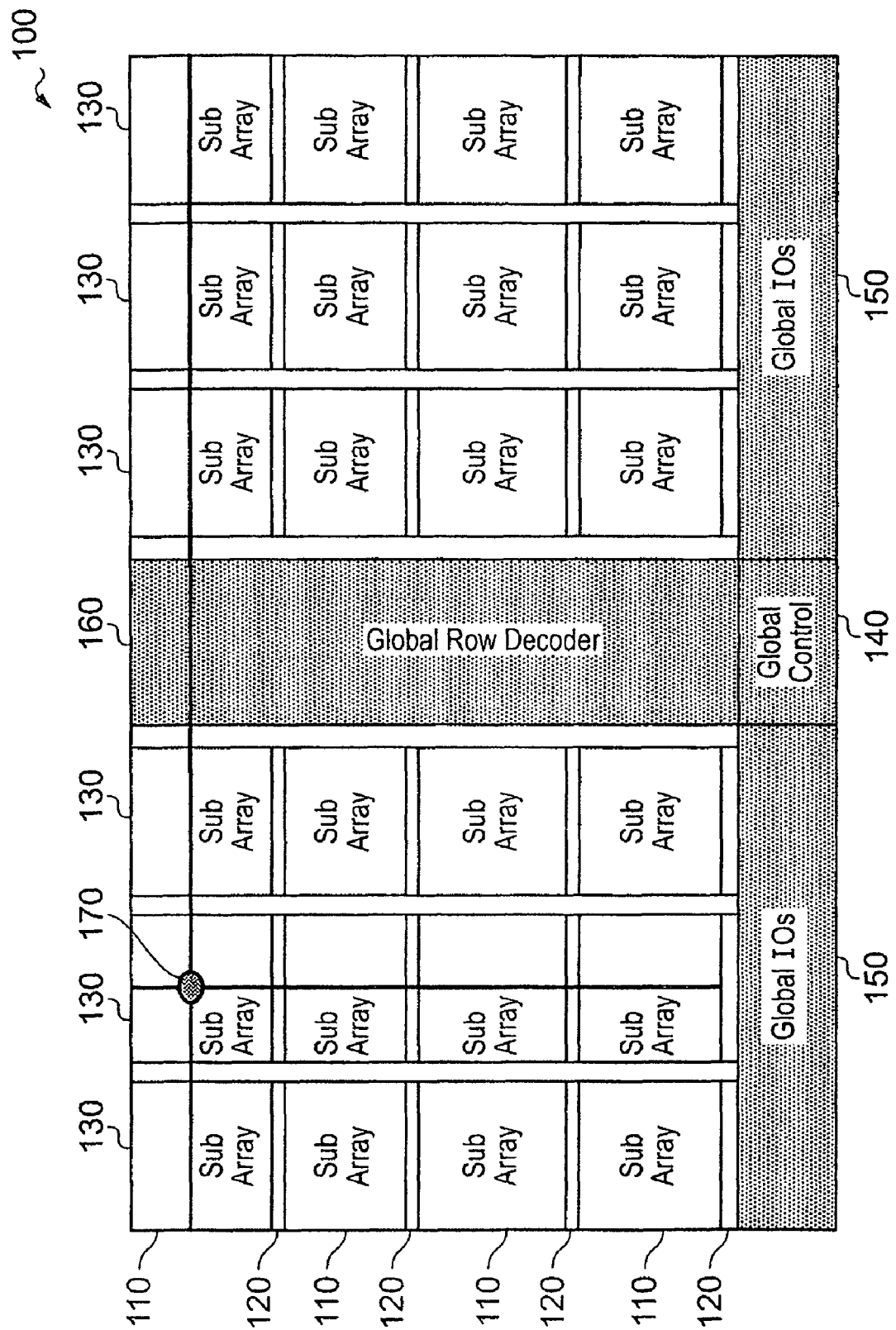
FIG. 1 schematically illustrates the arrangement of a memory device comprising a plurality of sub-arrays, in which the techniques of embodiments of the present invention may be employed.

As shown in FIG. 5, a plurality of sub-array blocks are connected in series to form a column, with the final sub-array block 500 being connected to the global IO circuitry 545 (which can be considered analogous to the global IO circuitry 150 shown in FIG. 1). Each sub-array block has a sub-array 505 of memory cells connected to local column multiplexer and sense amplifier circuitry 510, each sub-array comprising a plurality of rows and columns of memory cells. During a read operation, the column multiplexer will be used to select the bit line(s) connected to the column of memory cells containing the addressed memory cell such that when the addressed memory cell is activated by having its word line enabled, the sense amplifier circuitry can then determine the data value stored in that addressed memory cell from the voltage on the connected bit line(s). Whilst in some embodiments the sense amplifier circuitry will detect the read data value from the output of the column multiplexer, in an alternative embodiment the sense amplifier circuitry may be directly connected to the bit lines, with the column multiplexer receiving the output from the sense amplifier circuitry.

For the purposes of the present invention, it is immaterial what form the memory cells take, and accordingly the memory cells may be, for example ROM, memory cells, DRAM memory cells or SRAM memory cells. If the memory cells can be written to, as well as read from, then the local IO circuitry 510 will also include write driver circuitry to enable data values to be written into an addressed memory cell.

During the read operation, the read data value detected from an addressed memory cell by the local column multiplexer and sense amplifier circuitry 510 is routed to a latch 515, which may be constructed in a variety of ways. However, in one embodiment the latch is constructed as shown in FIG. 6, this configuration of latch being beneficial as it does not require any timing signals for its operation.

Figure 6:
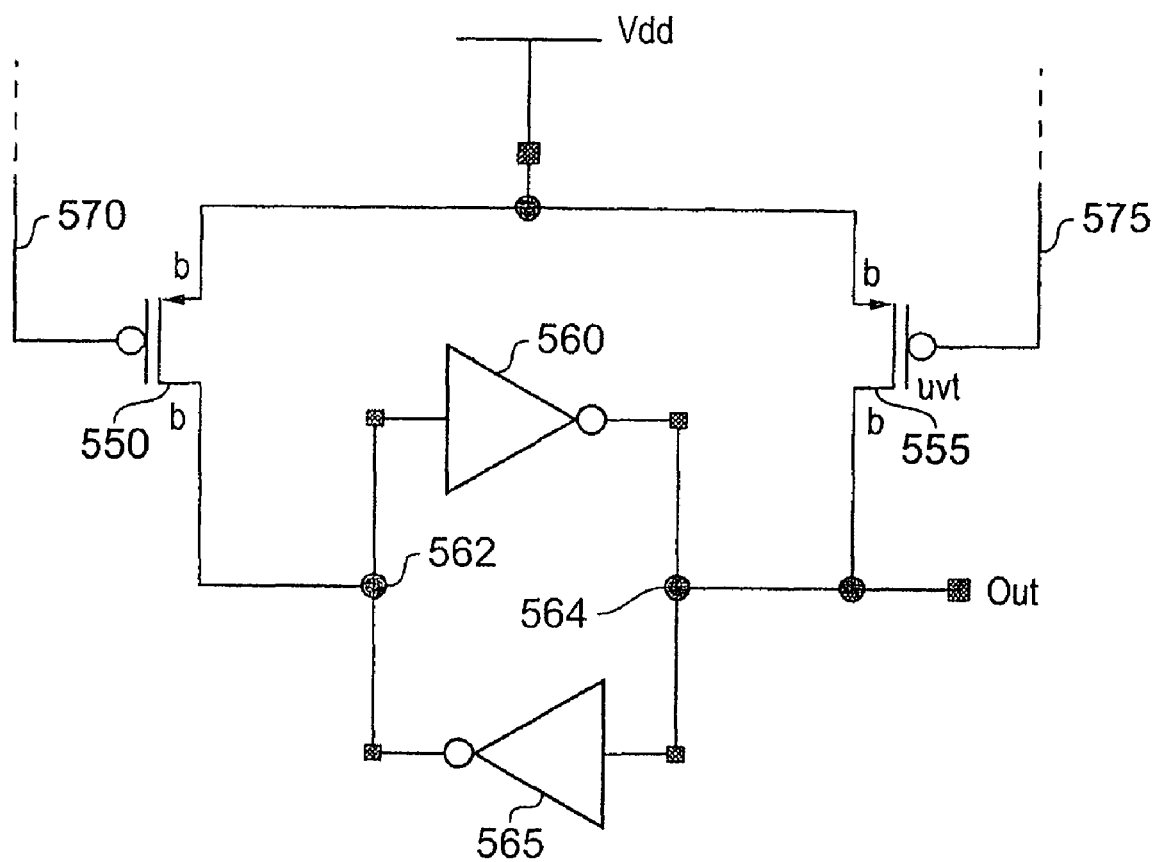
FIG. 6 schematically illustrates one embodiment of the latch circuits used within each sub-array block shown in FIG. 5.

In the example of FIG. 6, it is assumed that each memory cell is coupled to two bit lines, which will be referenced by sense amplifier circuitry during a read operation to produce two output signals, one at a logic one (Vdd) level and one at a logic zero (zero voltage) level, these two outputs being routed over paths 570, 575 to the latch circuitry. The latch circuitry in FIG. 6 is shared between all of the columns in the sub-array, since only one of those columns will contain the addressed memory cell for any particular read operation, and accordingly for only one of those columns will an output be produced from the local column multiplexer/sense amplifier circuitry 510 for any particular read operation.

At the input to the latch circuitry of FIG. 6, two PMOS transistors 550, 555 are provided. Whichever of those two PMOS transistors receives the zero voltage input will turn on, hence causing the correct read data value to be stored within the storage element of the latch formed by the two inverters 560, 565. In particular, it will be appreciated that if the input to the PMOS transistor 550 is at a zero voltage level, a logic one value will be stored at the node 562 and a logic zero value will be stored at the node 564. Conversely, if the zero voltage input is received at the PMOS transistor 555, the node 362 will be at a logic zero value and the node 364 will be at a logic one value.

To ensure correct operation of the latch circuitry, in one embodiment the output lines 570, 575 are precharged to the voltage level Vdd prior to the read operation being initiated.

Returning to FIG. 5, it can be seen that each sub-array block 500 includes propagation circuitry 520, which in one embodiment includes two transfer gates 525, 530. The first transfer gate 525 receives at its input the output of the latch 515, whilst the second transfer gate 530 receives at its input the output from a sub-array block 500 more distant than the current sub-array block from the global IO circuitry 545. For the sub-array block 500 at the top of the sub-array column, no input is received by the second transfer gate 530.

Figure 9:
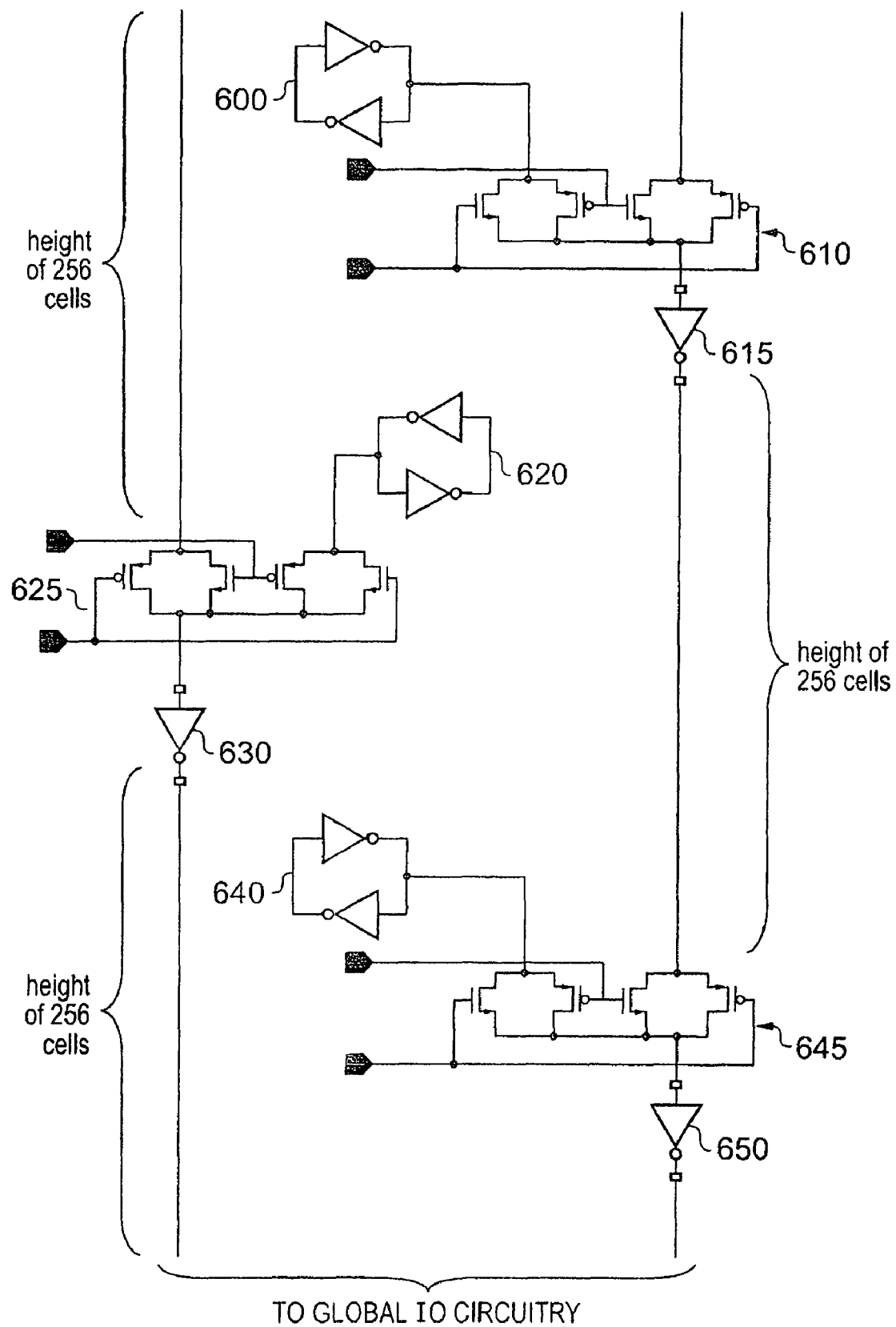
FIG. 9 schematically illustrates an alternative embodiment to FIG. 7, where every other sub-array block is linked to provide a higher speed path to the global IO circuitry.

The transfer gates 525, 530 can be arranged in a variety of ways, but as will be discussed later with reference to FIGS. 7 and 9, in one embodiment each transfer gate comprises an NMOS transistor and a PMOS transistor arranged back to back, thereby allowing both logic zero and logic one values to be transferred without loss. In alternative embodiments, it may be sufficient to replace each transfer gate with a pass gate consisting of a single transistor, but in that event the outputs of the pass gates will not always directly correspond to the inputs, due to the threshold voltage across the pass gate transistors, and reliance will be placed on the subsequent inverter circuitry to nullify that effect.

As shown in FIG. 5, the propagation circuitry 520 receives a transfer gate select signal 535 which is used to identify which of the transfer gates 525, 530 should be used to provide an output from the propagation circuitry 520. In one embodiment, this transfer gate select signal 535 is derived from the word line select signal provided to the associated sub-array 505. In particular, if the sub-array block contains the addressed memory cell, and accordingly one of the word lines is activated in the sub-array, then the transfer gate select signal 535 has a value indicating that transfer gate 1 525 should produce the output, whereas otherwise the transfer gate select signal 535 has a value indicating that transfer gate 2 530 should be used to generate the output.

The output from the propagation circuitry 520 is passed through a buffer circuit 540 used to amplify the output read data value from the propagation circuitry. By using the buffer circuitry, the same drive strength and thus speed can be assured for each propagation path between a sub-array block and its linked sub-array block, hence serving to ensure a high speed transfer between linked sub-array blocks, whilst also giving a pre-predicted delay.

Whilst the buffer circuits can be arranged in a variety of ways, in one embodiment, as shown in FIG. 5, the buffer circuits 540 take the form of inverters, inverters providing a very efficient mechanism for amplifying the output read data value.

For any particular read operation, it will be appreciated that only one of the sub-array blocks in a column will have a word line activated, and accordingly one sub-array block will produce a transfer gate select signal 535 causing its transfer gate 1 525 to produce the output from its propagation circuitry, whilst all other sub-array blocks in the column will produce transfer gate select signals 535 causing the transfer gate 2 530 of their propagation circuits 520 to produce the output read data value. Accordingly, it can be seen that irrespective of which sub-array block contains the addressed memory cell, a simple propagation path is provided from that sub-array block to the global IO circuitry 545. Since the timing delay between each linked sub-array block is predetermined, no complex timing issues arise, and the technique allows any number of sub-array blocks to be incorporated in the sub-array column without any modification being required to any sub-array block. Further, the technique provides a low power solution for routing the locally sensed read data to the global IO circuitry by keeping the propagation paths as short as possible.

It will be noted that where the buffer circuits are formed using inverters 540, then the number of inverters between any particular sub-array 505 and the global IO circuitry 545 may be an odd number or an even number, dependent on the location of the sub-array block containing that sub-array. To counter this effect, the number of inverters in the propagation path between a particular sub-array and the global IO circuitry 545 is used in one embodiment to determine the representation of the read data that is provided to the input of the propagation circuitry 520 within the sub-array block containing that sub-array. In particular, if an odd number of inverters is located between a particular sub-array 505 and the global IO circuitry 545, then the input to transfer gate 1 525 in the sub-array block containing that sub-array is arranged to be an inverse of the actual read data value required to be output to the global IO circuitry. This can be achieved in a variety of ways. For example, when data values are written to the sub-array, the sub-array 505 can be arranged to store an inverse of the actual provided write data, such that by the time any read data is received by the global IO circuitry 545, it will represent the correct read data value. Alternatively, the data values can be stored unaltered in the sub-array, but can be flipped as they are stored in the latch 515. If the latch of FIG. 6 is used, this can simply be achieved by reading the output of the latch from the left hand side of FIG. 6 rather than the right hand side of FIG. 6. Obviously, for any sub-arrays where there is an even number of inverter circuits between its sensed output and the global IO circuitry 545, no such modifications are required.

Figure 7:
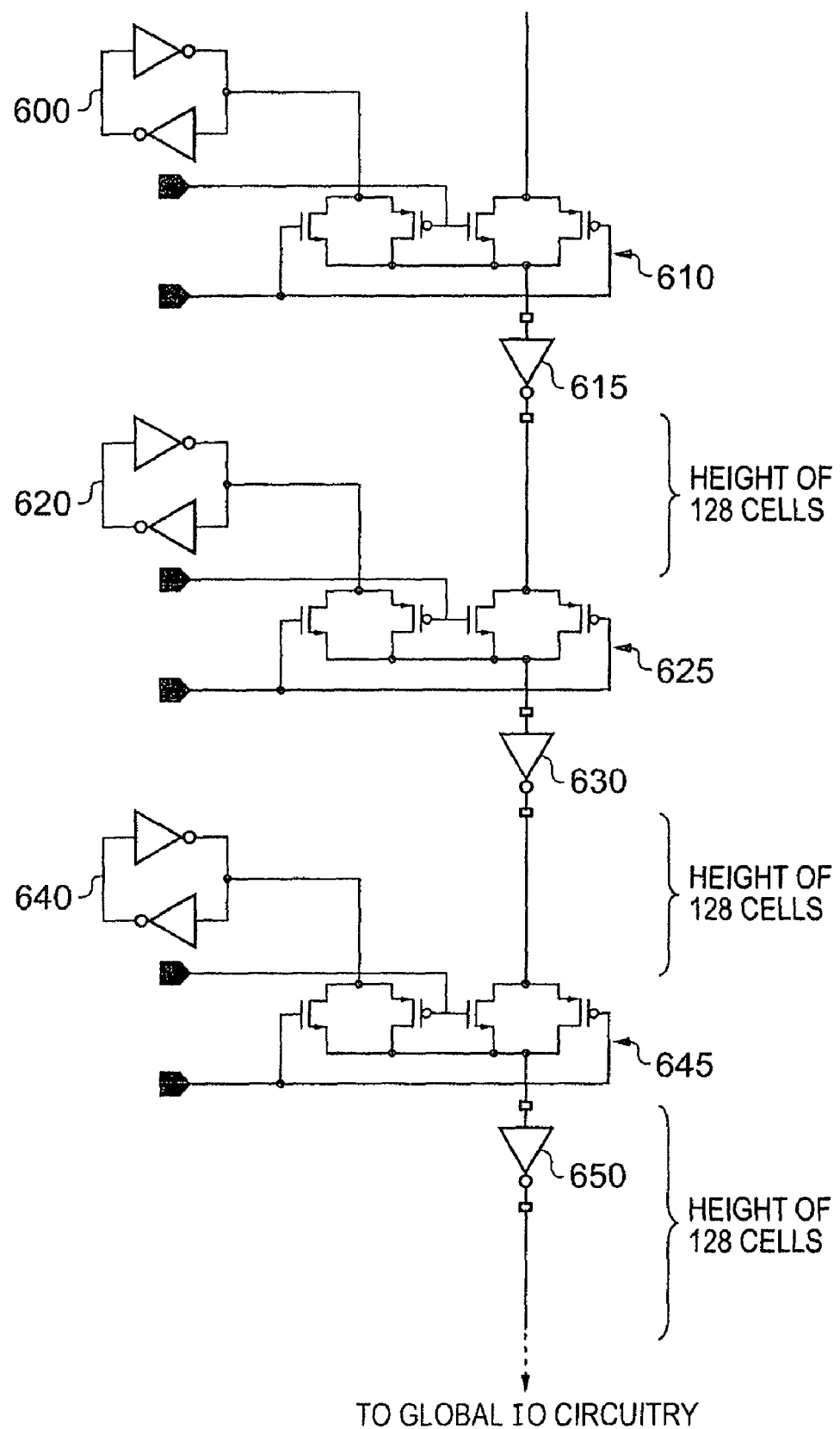
FIG. 7 schematically illustrates how adjacent sub-array blocks can be linked to provide a propagation path to the global IO circuitry in accordance with one embodiment.

FIG. 7 schematically illustrates the propagation path to the global IO circuitry 545 for a sequence of three sub-array blocks. For simplicity, in this diagram, only the two inverters 560, 565 of the latch in each sub-array block are shown (as the elements 600, 620 and 640), along with the associated propagation circuitry 610, 625, 645 and associated inverters 615, 630, 650.

Figure 2A:
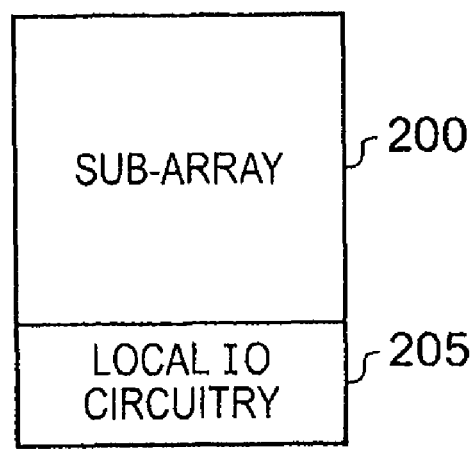
FIGS. 2A and 2B illustrate two different forms of sub-array that may be used within the memory device of FIG. 1.
Figure 2B:
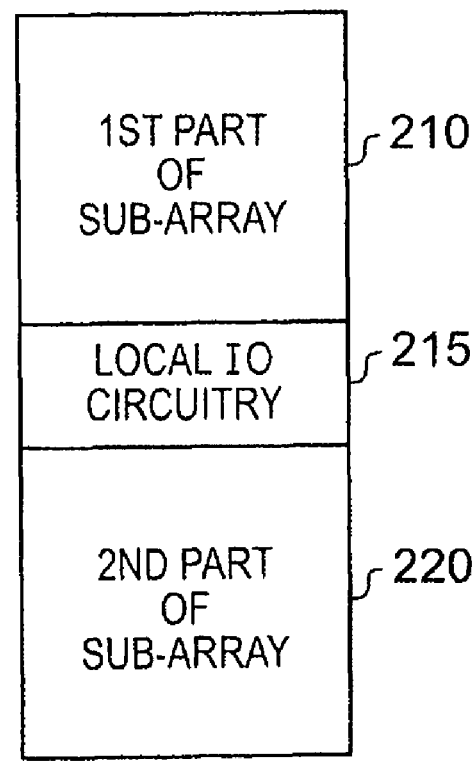
Figure 3:
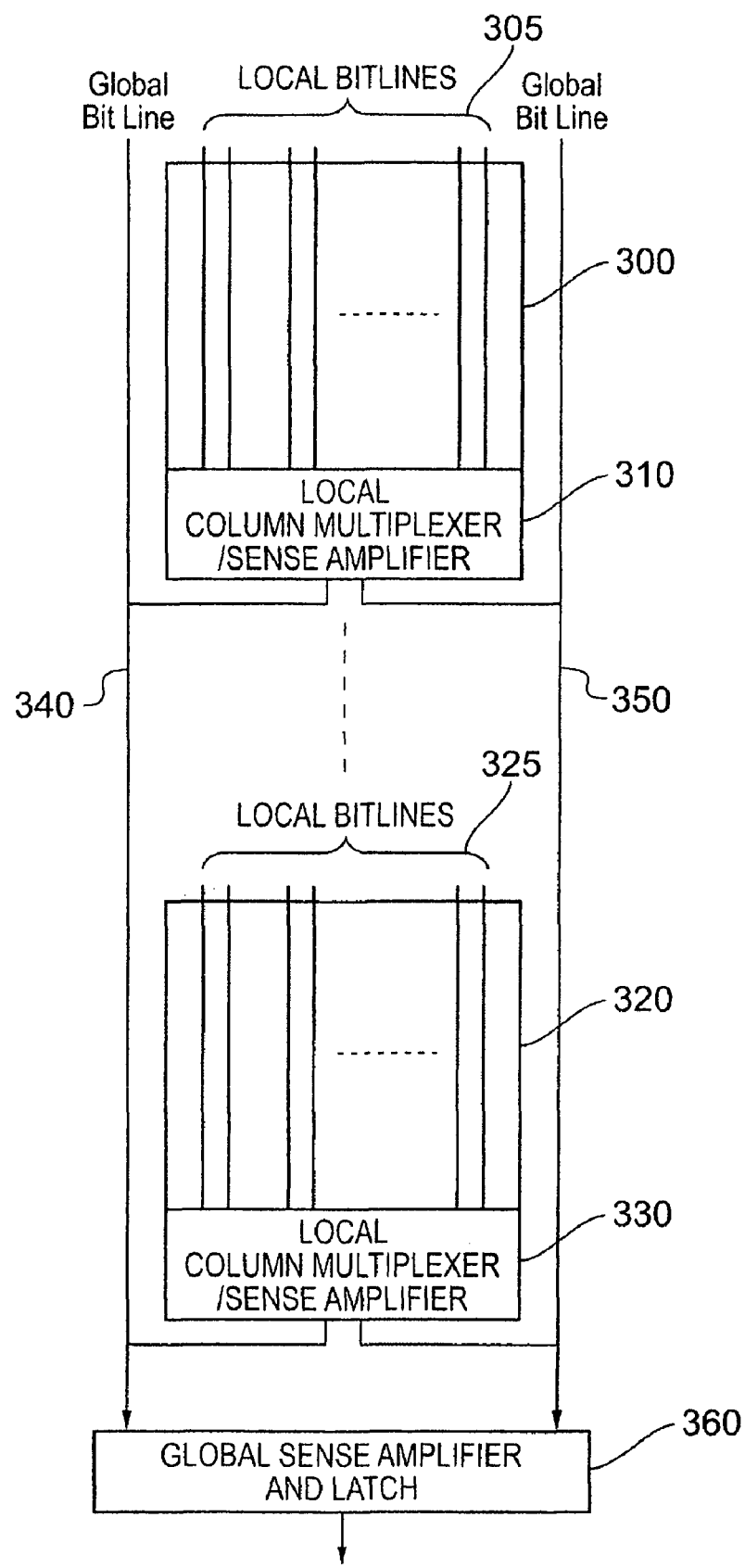
FIG. 3 illustrates a known prior art technique for routing a read data value from a sub-array to the global IO circuitry of the memory device.
Figure 4:
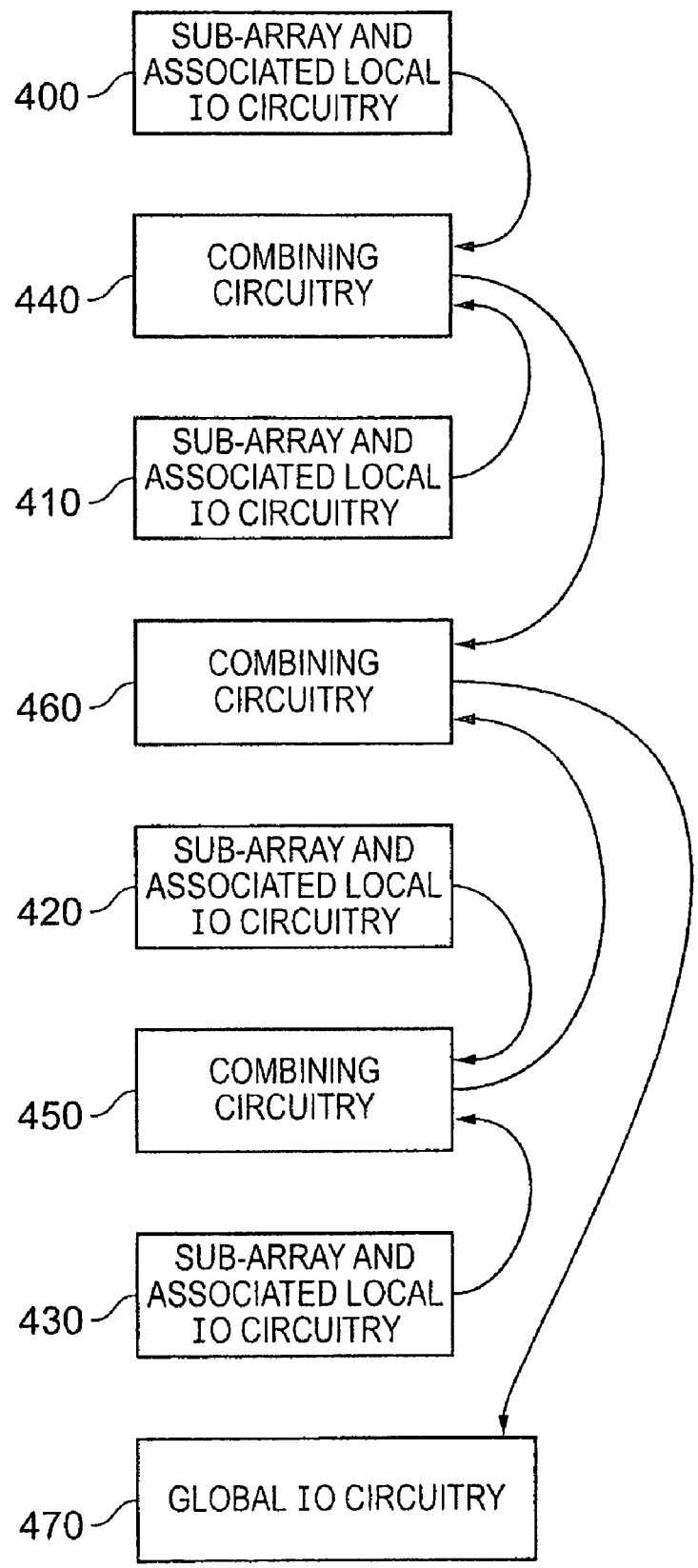
FIG. 4 illustrates an alternative prior art technique for routing a read data value from a sub-array to the global IO circuitry of the memory device.
Figure 11:
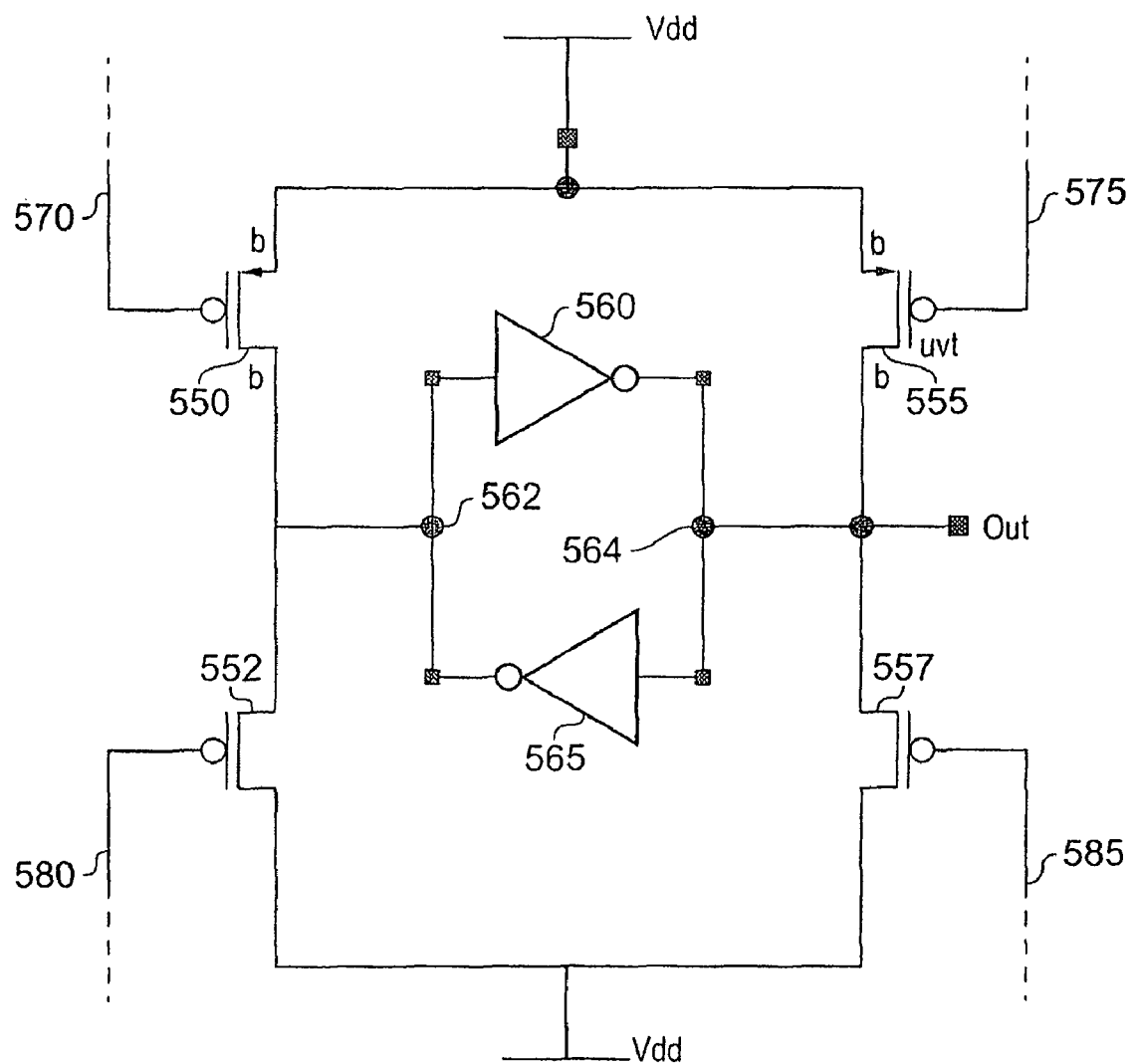
FIG. 11 schematically illustrates an adaptation of the latch circuit of FIG. 6 that is used in some embodiments of the present invention.

In this example, it is assumed that each sub-array contains 128 rows of memory cells, and accordingly as shown in FIG. 7, the path between each linked sub-array block covers the height of 128 memory cells. Whilst in one embodiment, the sub-array and local IO circuitry may be constructed as shown in FIG. 2A, in an alternative embodiment they may be constructed as shown in FIG. 2B, where each sub-array part includes 64 rows of memory cells, but both sub-array parts 210, 220 share the same latch 515. Considering the latch arrangement of FIG. 6, one way to achieve this is to adapt the latch as shown in FIG. 11, by replicating the two PMOS transistors 550, 555 as transistors 552, 557, so that the input lines 570, 575 represent the sensed output from the first sub-array part, and a corresponding pair of inputs 580, 585 represent the sensed output from the bit lines in the second sub-array part. Since only one of the sub-array parts will contain the addressed memory cell for any particular read operation, only one of these inputs will transition to a logic zero value, and accordingly the inverters 560, 565 can be shared between the four PMOS input transistors.

Figure 8:
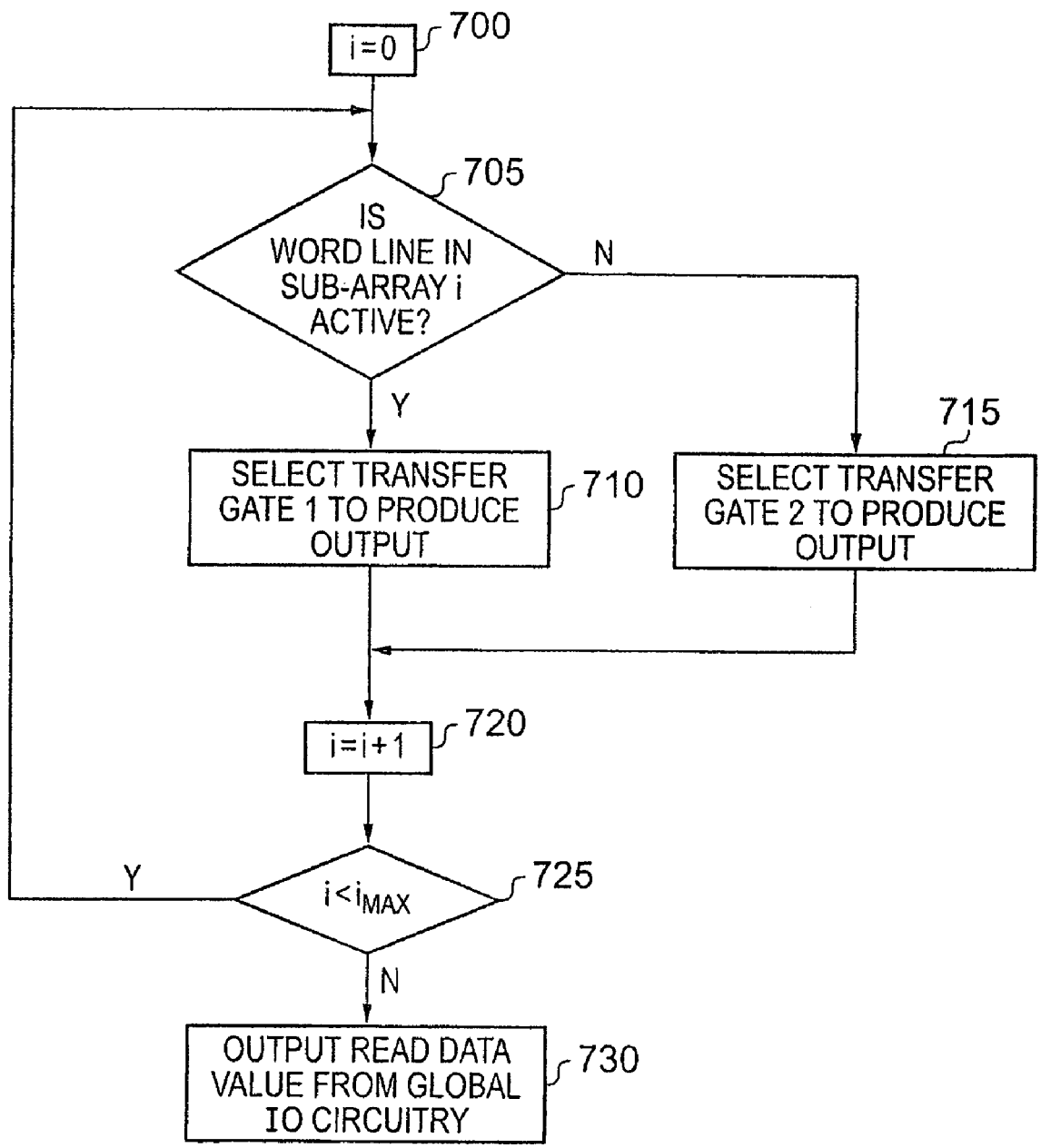
FIG. 8 is a flow diagram illustrating the method employed to propagate a read data value to the global IO circuitry in accordance with one embodiment of the present invention.

FIG. 8 is a flow diagram illustrating the process performed within the memory device to propagate the read data output over the propagation path to the global IO circuitry 545 in accordance with one embodiment. At step 700, a parameter i identifying the sub-array block is set equal to zero, hence identifying the sub-array block at the top of the sub-array column (i.e. most distant from the global IO circuitry 545).

At step 705, it is determined whether the word line in sub-array i is active. If it is, then transfer gate 1 525 is selected to produce the output at step 710, whereas otherwise the transfer gate 2 530 is selected to produce the output at step 715. This output is then produced by the propagation circuitry 520 and routed onto the next linked sub-array block via the inverter 540.

At step 720, i is incremented by one, whereafter at step 725 it is determined whether i is still less than $i_{MAX}$, $i_{MAX}$ being set equal to the total number of sub-arrays linked along the propagation path. If i is still less than $i_{MAX}$, then the process returns to step 705, whereas if i is no longer less than $i_{MAX}$, then the process proceeds to step 730, at which point the global IO circuitry will have received the read data value, and accordingly the read data value is output from the global IO circuitry.

For a particular size of memory device, the speed of the propagation path can be improved by decreasing the number of propagation circuits and associated inverters along the propagation path. For example, considering the particular example of FIG. 7 where each sub-array includes 128 memory cells, then assuming the sub-array column contains, say, 1024 word lines, the approach shown in FIG. 7 will require a chain of eight propagation circuits and associated inverters for the full sub-array column. As each inverter only has to amplify the signal sufficient to jump 128 memory cells (not much), the design can be modified as shown in FIG. 9 to produce two propagation paths in parallel, where in each propagation path the distance between linked propagation circuits/inverters is doubled. In particular, in the arrangement of FIG. 9, every other sub-array block is linked, so that 256 memory cells are jumped between each propagation circuit/inverter. Assuming again that each sub-array column has 1024 word lines, the approach of FIG. 9 will give a total of four inverter delays, each of which is fixed in timing. Such an approach will provide an extremely fast propagation path to the global IO circuitry 545. The global IO circuitry 545 would then be provided with a simple muxing circuit to choose between the signals received over the two propagation paths. Hence, for example, if the addressed memory cell resided in the sub-array coupled to the latch 620, then the global IO circuitry would be arranged to select the left hand propagation path from which to generate the output read data value.

Figure 10:
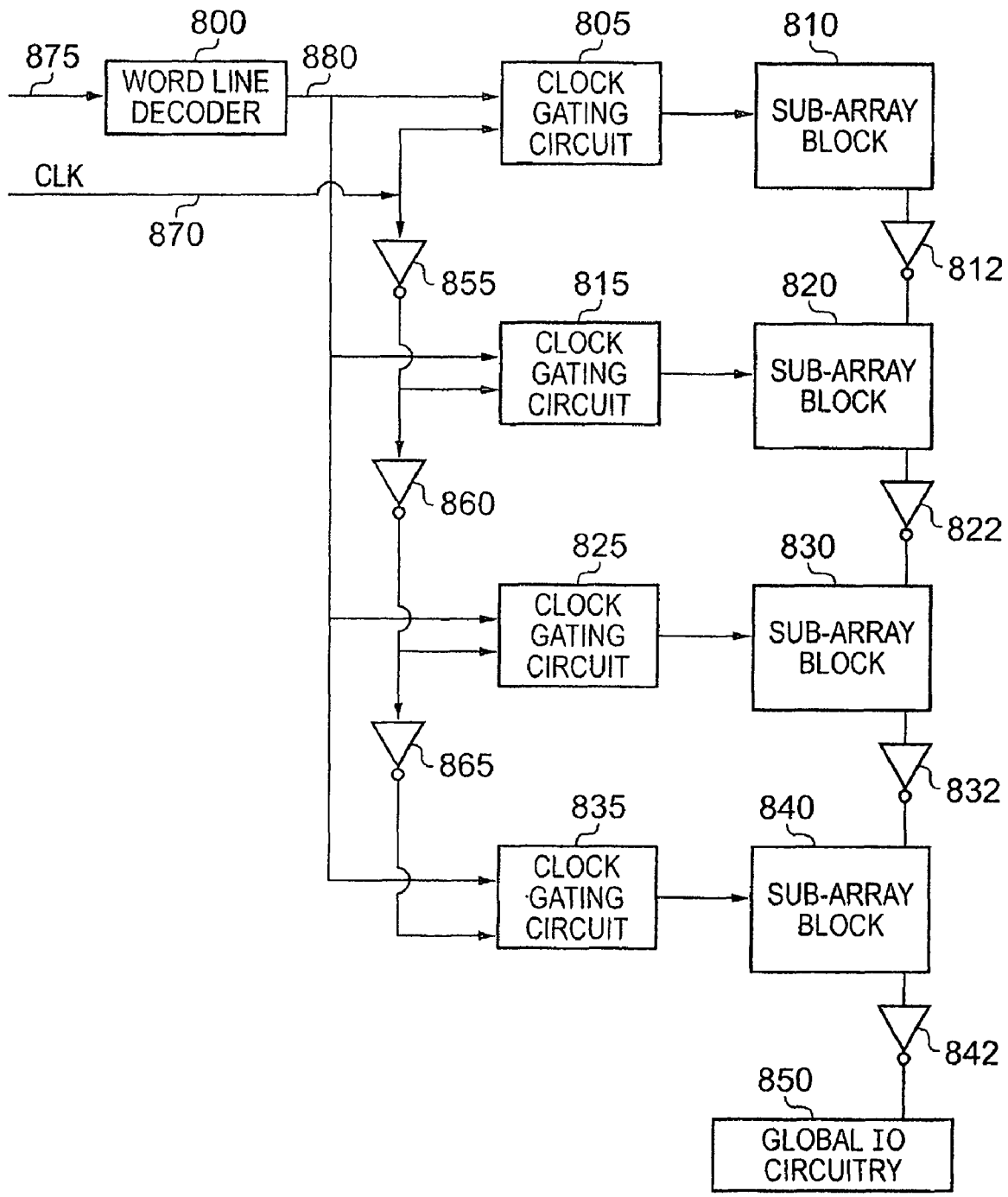
FIG. 10 illustrates an embodiment of the present invention where the clock signal to each sub-array block is staggered, resulting in a read data value being passed to the global IO circuitry in the same time, irrespective of the sub-array in which the addressed memory cell resides.

In the above described embodiments, it will be appreciated that the time taken to propagate a read data value to the global IO circuitry 545 will vary dependent on which sub-array the addressed memory cell resides in. Whilst in many implementations this will not be problematic, additional circuitry can be provided as shown in FIG. 10 if required in order to ensure that the read access time is the same irrespective of the sub-array in which the addressed memory cell resides. In particular, as shown in FIG. 10, a sub-array column includes four sub-array blocks 810, 820, 830, 840 connected in series, with the sub-array block 840 being closest to the global IO circuitry 850. Each sub-array block includes the components discussed earlier with reference to FIG. 5, although for the purposes of illustration here, the inverters 540 are shown externally to the sub-array blocks as inverter elements 812, 822, 832, 842.

To enable a data value to be read, it is necessary to activate a word line within one of the sub-array blocks containing the addressed memory cell. Based on the address received over path 875, the word line decoder 800 decodes the address in order to generate a word line select signal output over path 880. Normally the transfer of that word line select signal to each sub-array would be controlled by clock gating circuits 805, 815, 825, 835 based on a clock signal received over path 870, and usually each clock gating circuit would receive the same clock signal. However, in the embodiment shown in FIG. 10, a number of inverters 855, 860, 865 of the same construction as the inverters 812, 822, 832, 842 are provided along the clock signal propagation path, so that the receipt of the clock signal by the various clock gating circuits 805, 815, 825, 835 is staggered. This means that for read operations where the addressed memory cell resides in a sub-array block closer to the global IO circuitry, the word line is enabled slightly later in that sub-array than it would be for a read operation where the addressed memory cell is in a sub-array block more distant from the global IO circuitry 850. The combined effect of this, along with the inverters in the output read data value propagation path, is that a propagation delay equivalent to four inverters is incurred irrespective of the sub-array block in which the addressed memory cell resides, thereby ensuring that the global IO circuitry 850 receives the output read data value at the same time, irrespective of the location of the addressed memory cell.

It will be appreciated from the above discussions that the techniques of embodiments of the present invention provide a modular design for the sub-array blocks used to form each sub-array column within a memory device, with the same design of sub-array block being used irrespective of the number of sub-array blocks in any particular sub-array column. There is a predictable timing delay between each linked sub-array block, and the propagation path used to propagate a read data value to the global IO circuitry does not require any timing signals. The technique also provides a low power solution, due to the direct propagation paths used. Given the simple and modular nature of the design, the power consumption and speed of the design when used in any particular implementation is predictable and easily calculated. Furthermore, the short paths between each propagation circuit/inverter makes the propagation path insensitive to RC delays.

One further benefit realised when using the technique of embodiments of the present invention is that a switch from a logic zero value to a logic one value, or vice versa, will never consume the fall power that would be required to perform such a switch across the entire propagation path. In particular, as 50% of the length of the propagation path will use inverted signals, only 50% of the power that might otherwise be required in one switch cycle is consumed. For large memories with lots of columns, this is very beneficial, as it significantly reduces the EMC (ElectroMagnetic Compatibility) noise generation.

The technique of embodiments of the present invention is generally applicable across a variety of technologies, and for various different kinds of memory cells. For example, the invention can be used irrespective of whether the individual memory cells are constructed using bulk CMOS (Complementary Metal Oxide Semiconductor) technology or are alternatively constructed using SOI (Silicon-On-Insulator) technology. Further, the invention is equally applicable to memory devices that are single ported devices, or to multi ported devices providing separate write and read paths.

Although a particular embodiment of the invention has been described herein, it will be apparent that the invention is not limited thereto, and that many modifications and additions may be made within the scope of the invention. For example, various combinations of the features of the following dependent claims could be made with the features of the independent claims without departing from the scope of the present invention.

We claim:

1. A memory device, comprising:
a plurality of sub-arrays arranged to form at least one sub-array column having a first end and a second end, each sub-array comprising a plurality of memory cells arranged in a plurality of memory cell rows and at least one memory cell column;
sub-array access circuitry associated with each sub-array, for detecting read data from a selected memory cell column of said associated sub-array during a read operation; and
global access circuitry arranged to interface with said first end of said at least one sub-array column;
each sub-array access circuitry comprising propagation circuitry for producing an output read data value, the propagation circuitry having a first input for receiving the read data detected from the selected memory cell column of said associated sub-array during said read operation and a second input for receiving an output read data value produced by a linked sub-array access circuitry associated with a sub-array in said sub-array column nearer said second end of the sub-array column, and the propagation circuitry receiving a control signal for identifying which of the first or second inputs is to be used to produce the output read data value;
wherein an output read data value produced by any sub-array access circuitry is propagated to the global access circuitry via any linked sub-array access circuitry in the sub-array column between that sub-array access circuitry and the global access circuitry.

2. A memory device as claimed in claim 1, wherein the propagation circuitry comprises a first transfer gate connected to the first input, and a second transfer gate connected to the second input, the control signal identifying which of the first and second transfer gates is to be used to produce the output read data value.

3. A memory device as claimed in claim 1, wherein each sub-array access circuitry further comprises a buffer circuit for amplifying the output read data value.

4. A memory device as claimed in claim 3, wherein the buffer circuit comprises an inverter circuit, and for each sub-array the number of inverter circuits that the read data detected from the selected memory cell column of said sub-array will pass through as that read data is propagated to the global input-output circuitry determines the representation of that read data provided to the first input of the propagation circuitry within the associated sub-array access circuitry.

5. A memory device as claimed in claim 1, wherein each sub-array access circuitry comprises latch circuitry for storing the read data detected from the selected memory cell column of said associated sub-array during said read operation.

6. A memory device as claimed in claim 1, wherein for each sub-array access circuitry, the linked sub-array access circuitry is that sub-array access circuitry associated with an adjacent sub-array in said sub-array column nearer said second end of the sub-array column.

7. A memory device as claimed in claim 6, wherein the sub-array access circuitry associated with the sub-array nearest the second end of said sub-array column has no linked sub-array access circuitry, and the second input of the propagation circuitry in that sub-array access circuitry is not used.

8. A memory device as claimed in claim 1, wherein the memory cells can be subjected to both write operations and read operations, and each sub-array access circuitry is further arranged to provide write data to a selected memory cell column of said associated sub-array during a write operation.

9. A memory device as claimed in claim 1, wherein each sub-array in said sub-array column receives a word line select signal identifying a memory cell row contained an addressed memory cell, for those sub-arrays in the sub-array column whose associated sub-array access circuitry are linked, the timing of the receipt of said word line select signal being staggered to ensure that the time at which the output read data value is received by the global access circuitry is independent of which sub-array the addressed memory cell resides in.

10. A memory device as claimed in claim 9, wherein the timing of the receipt of said word line select signal is staggered by staggering receipt of a clock signal by each sub-array.

11. A method of operating a memory device, the memory device comprising a plurality of sub-arrays arranged to form at least one sub-array column having a first end and a second end, each sub-array comprising a plurality of memory cells arranged in a plurality of memory cell rows and at least one memory cell column, sub-array access circuitry associated with each sub-array for detecting read data from a selected memory cell column of said associated sub-array during a read operation, and global access circuitry arranged to interface with said first end of said at least one sub-array column, the method comprising the steps of:

within each sub-array access circuitry:
(i) receiving at a first input the read data detected from the selected memory cell column of said associated sub-array during said read operation;
(ii) receiving at a second input an output read data value produced by a linked sub-array access circuitry associated with a sub-array in said sub-array column nearer said second end of the sub-array column; and
(iii) producing an output read data value in dependence on a control signal identifying which of the first or second inputs is to be used to produce the output read data value;

wherein an output read data value produced by any sub-array access circuitry is propagated to the global access circuitry via any linked sub-array access circuitry in the sub-array column between that sub-array access circuitry and the global access circuitry.

12. A memory device, comprising:
a plurality of sub-array means arranged to form at least one sub-array column having a first end and a second end, each sub-array means comprising a plurality of memory cell means arranged in a plurality of memory cell rows and at least one memory cell column;

sub-array access means associated with each sub-array means, for detecting read data from a selected memory cell column of said associated sub-array means during a read operation; and global access means for interfacing with said first end of said at least one sub-array column;

each sub-array access means comprising propagation means for producing an output read data value, the propagation means having a first input for receiving the read data detected from the selected memory cell column of said associated sub-array means during said read operation and a second input for receiving an output read data value produced by a linked sub-array access means associated with a sub-array means in said sub-array column nearer said second end of the sub-array column, and the propagation means for receiving a control signal for identifying which of the first or second inputs is to be used to produce the output read data value;

wherein an output read data value produced by any sub-array access means is propagated to the global access means via any linked sub-array access means in the sub-array column between that sub-array access means and the global access means.

* * * * *